United States Patent
Lee et al.

(10) Patent No.: US 8,723,250 B2
(45) Date of Patent: May 13, 2014

(54) INTEGRATED CIRCUIT DEVICES INCLUDING COMPLEX DIELECTRIC LAYERS AND RELATED FABRICATION METHODS

(75) Inventors: Jong-cheol Lee, Seoul (KR); Ki-yeon Park, Hwaseong-si (KR); Chun-hyung Chung, Seoul (KR); Cha-young Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 167 days.

(21) Appl. No.: 13/042,871

(22) Filed: Mar. 8, 2011

(65) Prior Publication Data

US 2011/0227143 A1 Sep. 22, 2011

(30) Foreign Application Priority Data

Mar. 16, 2010 (KR) ........................ 10-2010-0023404

(51) Int. Cl.
*H01L 21/768* (2006.01)
*H01L 49/02* (2006.01)

(52) U.S. Cl.
CPC ..... *H01L 21/76835* (2013.01); *H01L 21/76831* (2013.01); *H01L 28/55* (2013.01)
USPC ........................................... 257/325

(58) Field of Classification Search
USPC ................... 257/295–296, 324–325
See application file for complete search history.

(56) References Cited

U.S. PATENT DOCUMENTS

| 7,514,315 | B2 * | 4/2009 | Lee et al. | 438/238 |
|---|---|---|---|---|
| 7,791,125 | B2 * | 9/2010 | Choi et al. | 257/310 |
| 7,939,872 | B2 * | 5/2011 | Lee et al. | 257/296 |
| 8,148,269 | B2 * | 4/2012 | Balseanu et al. | 438/706 |
| 8,399,364 | B2 * | 3/2013 | Kim et al. | 438/763 |
| 2006/0046387 | A1 * | 3/2006 | Choi et al. | 438/257 |
| 2006/0264067 | A1 * | 11/2006 | Kher et al. | 438/785 |
| 2007/0257370 | A1 * | 11/2007 | Lee et al. | 257/758 |
| 2008/0087930 | A1 * | 4/2008 | Lee et al. | 257/300 |
| 2008/0164582 | A1 * | 7/2008 | Govindarajan | 257/635 |
| 2008/0258271 | A1 * | 10/2008 | Lee et al. | 257/637 |
| 2009/0134445 | A1 * | 5/2009 | Park et al. | 257/316 |
| 2009/0195962 | A1 * | 8/2009 | Lee et al. | 361/305 |
| 2009/0263972 | A1 * | 10/2009 | Balseanu et al. | 438/696 |
| 2009/0309187 | A1 * | 12/2009 | Choi et al. | 257/532 |
| 2010/0006954 | A1 * | 1/2010 | Huang et al. | 257/410 |
| 2011/0230056 | A1 * | 9/2011 | Kim et al. | 438/763 |
| 2011/0242727 | A1 * | 10/2011 | Kim et al. | 361/311 |

FOREIGN PATENT DOCUMENTS

| KR | 1020040002818 A | 1/2004 |
|---|---|---|
| KR | 1020040077309 A | 9/2004 |
| KR | 1020050061077 A | 6/2005 |
| KR | 1020060024189 A | 3/2006 |

\* cited by examiner

*Primary Examiner* — Nathan Ha
(74) *Attorney, Agent, or Firm* — Myers Bigel Sibley & Sajovec, PA

(57) ABSTRACT

An electronic device includes a lower layer, a complex dielectric layer on the lower layer, and an upper layer on the complex dielectric layer. The complex dielectric layer includes an amorphous metal silicate layer and a crystalline metal-based insulating layer thereon. Related fabrication methods are also discussed.

20 Claims, 7 Drawing Sheets

INTEGRATED CIRCUIT DEVICES INCLUDING COMPLEX DIELECTRIC LAYERS AND RELATED FABRICATION METHODS

CROSS-REFERENCE TO RELATED APPLICATIONS

This application claims priority under 35 U.S.C. §119 from Korean Patent Application No. 10-2010-0023404, filed on Mar. 16, 2010, in the Korean Intellectual Property Office, the disclosure of which is incorporated by reference herein in its entirety.

BACKGROUND

The inventive concept relates to electronic devices, and more particularly, to electronic devices including dielectric layers and related methods of fabrication.

Development of the semiconductor industry and demands of users have lead to highly integrated and high-performance electronic devices. Accordingly, the demand for highly integrated and highly performing semiconductor devices, which are key components of electronic devices, is ever increasing. In particular, some materials used as insulating layers in semiconductor devices may not satisfy desired dielectric characteristics and/or insulating characteristics.

SUMMARY

Some embodiments of the inventive concept provide electronic devices including a complex dielectric layer.

According to some embodiments of the inventive concept, an electronic device includes a lower layer, a complex dielectric layer on the lower layer, and an upper layer on the complex dielectric layer. The complex dielectric layer includes an amorphous metallic silicate layer and a crystalline metal-based insulating layer thereon.

In some embodiments, the amorphous metal silicate layer and the crystalline metal-based insulating layer may be in direct contact, and may each include a same or identical metal. In some embodiments, the metal may comprise a higher percentage of the crystalline metal-based insulating layer than at least one other metal included therein.

In some embodiments, the lower layer may be a substrate including an active region in which a transistor may be formed.

In some embodiments, the upper layer may be an upper electrode layer directly on the complex dielectric layer. A lower electrode layer or a charge storage layer may be disposed directly on the complex dielectric layer between the complex dielectric layer and the substrate.

In some embodiments, the crystalline metal-based insulating layer may include a crystalline metallic oxide and/or a crystalline metallic silicate.

In some embodiments, the crystalline metallic oxide may include hafnium and/or zirconium.

In some embodiments, the crystalline metallic oxide may have a crystal structure corresponding to a cubic system, a tetragonal system, or an orthorhombic system.

In some embodiments, the crystalline metallic oxide may have a rutile structure.

In some embodiments, the crystalline metal-based insulating layer may be a multilayer including at least two layers selected from the group consisting of a crystalline titanium-based insulating layer, a crystalline hafnium-based insulating layer, a crystalline zirconium-based insulating layer, and a crystalline hafnium-zirconium-based insulating layer.

In some embodiments, the amorphous metallic silicate layer may be an amorphous metal-based insulating layer having at least one common metal atom with one or more of the at least two layers included in the multilayer crystalline metal-based insulating layer. The one or more of the at least two layers may be in direct contact with the amorphous metallic silicate layer.

In some embodiments, the amorphous metallic silicate layer may be disposed in the multilayer between the at least two layers.

According further embodiments of the inventive concept, an integrated circuit device includes a substrate including an active region including at least one a transistor; an interlayer insulating layer including a contact plug extending therethrough that is electrically connected to the transistor; a lower electrode layer on the interlayer insulating layer and electrically connected to the contact plug; a capacitor dielectric layer on the lower electrode layer; and an upper electrode layer on the capacitor dielectric layer. The capacitor dielectric layer is a complex dielectric layer including an amorphous metallic silicate layer and a crystalline metal-based insulating layer.

According to still further embodiments of the inventive concept, an integrated circuit device includes a substrate including an active region therein; a tunneling insulation layer and a charge storage layer sequentially stacked on the substrate; a blocking insulating layer on the charge storage layer; and an electrode layer on the blocking insulating layer. The blocking insulating layer is a complex dielectric layer including an amorphous metallic silicate layer and a crystalline metal-based insulating layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Figure 1:
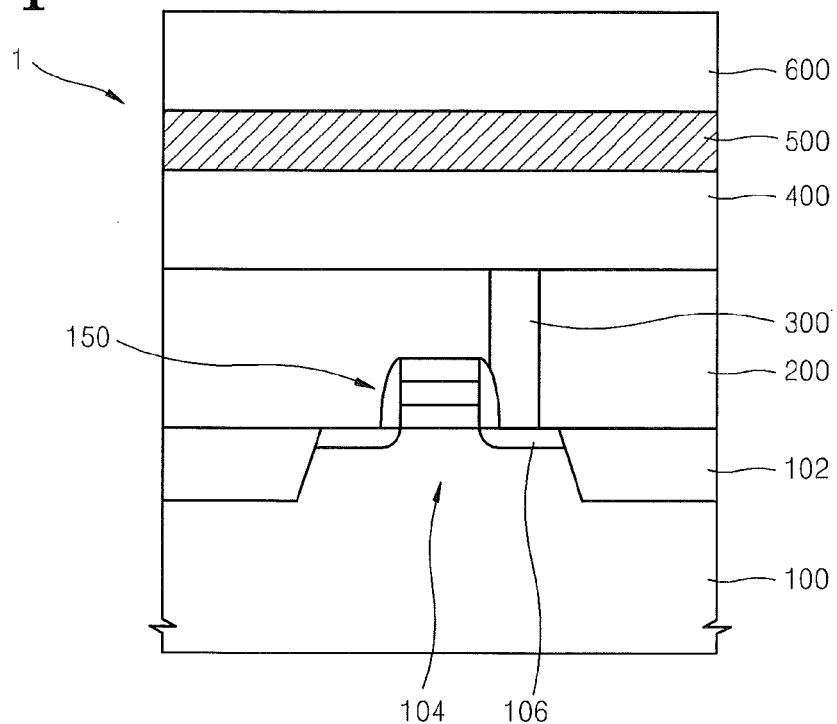
FIG. 1 is a sectional view of an aspect of a semiconductor device including a complex dielectric layer according to some embodiments of the inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to," "directly coupled to," or "in direct contact with" another element or layer, there are no intervening elements or layers present. Other expressions for describing relationships between elements, for example, "between" and "immediately between" or "neighboring" and "directly neighboring" may also be understood likewise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a sectional view of an aspect of a semiconductor device 1 including a complex dielectric layer 500 according to some embodiments of the inventive concept. As used herein, a "complex" layer may include multiple components or layers of different materials, and may also be referred to herein as a compound layer.

Referring to FIG. 1, the semiconductor device 1 includes the complex dielectric layer 500 formed on a semiconductor substrate 100. The complex dielectric layer 500 may be used as a dielectric layer of a capacitor. The semiconductor substrate 100 may be formed of, for example, a conventional semiconductor material, such as silicon. For example, an impurity implantation region (not shown) such as a well (used in a semiconductor device such as a transistor) and a device isolation layer 102 may be formed in the semiconductor substrate 100. The device isolation layer 102 may include, for example, silicon oxide. An active region 104 isolated in the semiconductor substrate 100 may be defined by the device isolation layer 102. The active region 104 may include source and drain regions 106, and a gate structure 150 including a gate insulating layer and gate lines may be formed in the active region 104, in which the gate structure 150 constitutes a transistor. The gate structure 150 may further include bit lines (not shown), and the semiconductor device 1 may further include an interlayer insulating layer 200 including a contact plug 300 that is connected to the transistor through the active region 104.

The interlayer insulating layer 200 may be a homogenous material layer, or a heterogeneous material layer obtained by performing deposition of two or more layers. For example, the interlayer insulating layer 200 may include an insulating layer for separating the gate lines, an insulating layer for separating the bit lines, an insulating layer for separating the gate lines from the bit lines, and an insulating layer covering the bit lines. In addition, each of the insulating layers may also be a homogenous material layer, or a heterogeneous material layer obtained by performing deposition twice or more. The interlayer insulating layer 200 may include, for example, a silicon oxidation layer.

The contact plug 300 may be formed after the interlayer insulating layer 200 is etched to expose the active region 104, in particular, one of the source or drain regions 106. The contact plug 300 may be formed by depositing doped polysilicon, metal, metallic silicide, or metallic nitride. Alternatively, the contact plug 300 may be formed using only doped polysilicon. However, if the interlayer insulating layer 200 is a heterogeneous material layer, many processes may be used to form the interlayer insulating layer 200. For example, the interlayer insulating layer 200 may be formed using the following two processes: a portion of the insulating layer for separating the gate lines is etched to form a landing pad connected to the transistor through the active region 104, in particular, through the source or drain region 106; and a portion of the insulating layer for separating the bit lines and a portion of the insulating layer for separating the gate lines from the bit lines are etched to form a buried plug connected to the landing pad. Each of the landing pad and the buried plug may be formed by depositing doped polysilicon, metal, metallic silicide, or metallic nitride. Alternatively, each of the landing pad and the buried plug may be formed using only doped polysilicon. In addition, if necessary, an additional plug connected to the buried plug may be further formed.

The gate lines may be electrically insulated from the active region 104 by the gate insulating layer, and may be formed of a doped polysilicon, metal (W, Ti, Cu etc), metallic silicide, and/or metallic nitride, and/or may include a stacked structure thereof. In addition, a capping pattern may be formed on the gate lines, and gate spacers may be formed on opposite sides of the gate lines and the capping pattern. The gate insulating layer may be a silicon oxidation layer or an insulating layer with a high dielectric constant. In addition, the capping pattern and the gate spacers may be formed using silicon nitride.

The bit lines may be perpendicular to or parallel to the gate lines, and may be insulated from the gate lines by using an insulating material. The bit lines may be formed of a doped polysilicon, metal (W, Ti, Cu etc), metallic silicide, or metallic nitride or may have a stack structure thereof. A bit line capping pattern (not shown) may be formed on the bit lines, and bit line spacers (not shown) may be formed on opposite sides of the bit lines and the bit line capping pattern.

In order to form a capacitor, a lower electrode layer 400, which is a conductor connected to the contact plug 300, may be formed. The lower electrode layer 400 may be formed of a material that does not induce oxidation in a subsequent process. The lower electrode layer 400 may be formed of, for example, at least one material selected from the group consisting of polysilicon, metal, metallic nitride, and metallic silicide.

Although the lower electrode layer 400 is illustrated as a substantially flat layer in FIG. 1, the inventive concept is not limited thereto. That is, the lower electrode layer 400 may have any of various structures as long as the capacitor structure including two electrodes and a dielectric formed between the electrodes is formed.

The complex dielectric layer 500 may be formed on the lower electrode layer 400 as the dielectric layer of a capacitor. The complex dielectric layer 500 may include an amorphous metallic silicate layer and a crystalline metal-based insulating layer, and will be further described in detail later. The crystalline metal-based insulating layer may include crystalline metallic oxide or crystalline metallic silicate. An upper electrode layer 600 (hereinafter, also referred to as an electrode layer) may be formed on the complex dielectric layer 500. The upper electrode layer 600 may be formed of, for example, at least one conductive material selected from the group consisting of doped polysilicon, metal (Al, W, Cu, Ti, Ir, Ru, Pt, etc.), metallic silicide, metallic nitride, and a conductive metallic oxide ($RuO_2$, $IrO_2$, $SrRuO_3$, etc.).

When a crystalline metal-based insulating layer is used as a capacitor dielectric layer, the crystalline metal-based insulating layer may not have a perfect single crystal structure. Accordingly, the capacitor dielectric layer including the crystalline metal-based insulating layer may have a grain boundary. Accordingly, when the capacitor dielectric layer including the crystalline metal-based insulating layer is formed on the lower electrode layer 400, the capacitor dielectric layer may be slightly affected by a crystal structure of the lower electrode layer 400. Accordingly, it may appear that a grain boundary of the lower electrode layer 400 is connected to a grain boundary of the capacitor dielectric layer.

Likewise, when the upper electrode layer 600 is formed on the capacitor dielectric layer including the crystalline metal-based insulating layer, the upper electrode layer 600 may be slightly affected by a crystal structure of the capacitor dielectric layer. Accordingly, it may appear that the grain boundary of the capacitor dielectric layer is connected to a grain boundary of the upper electrode layer 600. Hereinafter, the structure of grain boundaries connected between at least two or more layers will be referred to as a connected grain boundary.

Since the connected grain boundary may function as a passage for a leakage current, formation of the connected grain boundary may lead to a high leakage current. However, if the complex dielectric layer 500 including the crystalline metal-based insulating layer and the amorphous metallic silicate layer is used as the capacitor dielectric layer, the formation of the connected grain boundary or the passage for the leakage current may be blocked by using the amorphous metallic silicate layer.

Figure 2:
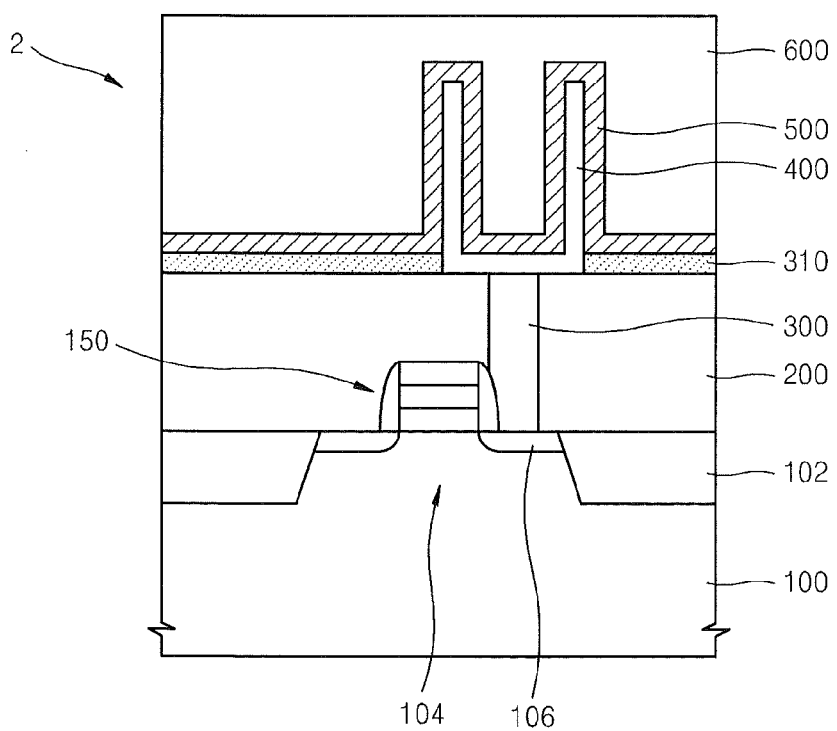
FIG. 2 is a sectional view of another aspect of a semiconductor device including a complex dielectric layer according to some embodiments of the inventive concept.

FIG. 2 is a sectional view of another aspect of a semiconductor device 2 including a complex dielectric layer 500 according to some embodiments of the inventive concept.

Referring to FIG. 2, a lower electrode layer 400 may have a cylindrical-shape. In order to form the cylinder-shaped lower electrode layer 400, for example, a mold layer (not shown) may be formed on an interlayer insulating layer 200 having a contact plug 300. Then, an opening (not shown) exposing the contact plug 300 is formed in the mold layer, and a lower electrode material layer (not shown) may be formed on the mold layer in such a way that the opening is not completely filled and a surface of the mold layer exposed by the opening is completely covered. Then, the lower electrode material layer formed on the surface of the mold layer is removed while a portion of the lower electrode material layer in the opening remains, and the mold layer is removed.

In this regard, to prevent the interlayer insulating layer 200 from being removed when the mold layer is removed, an etch stopping pattern 310 exposing the contact plug 300 may be formed on the interlayer insulating layer 200.

The complex dielectric layer 500 and an upper electrode layer 600 may be sequentially formed on the cylinder-shaped lower electrode layer 400. Thus, the semiconductor device 2 including a capacitor is formed.

Figure 3:
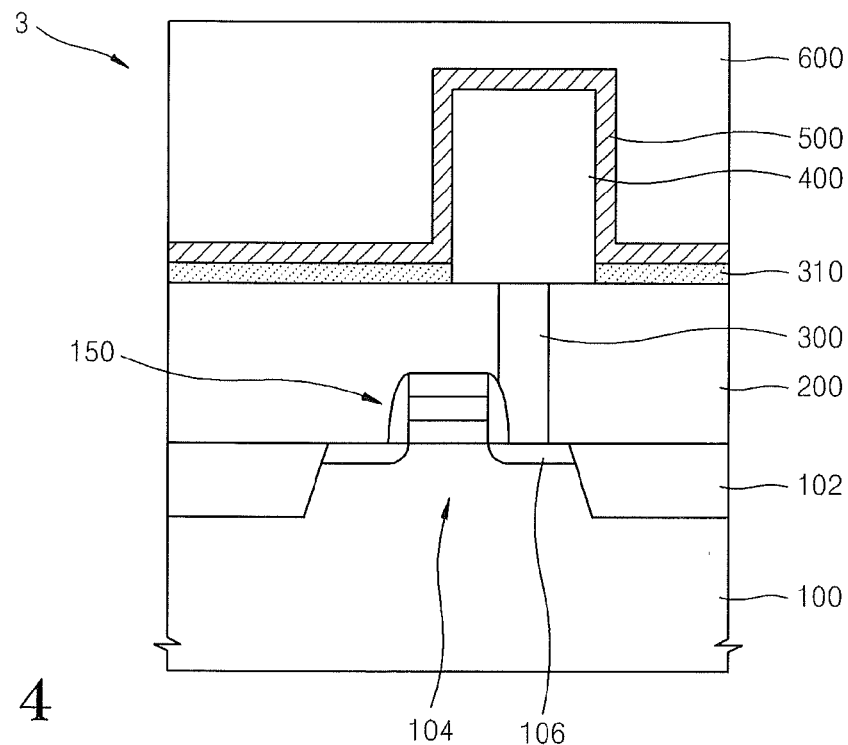
FIG. 3 is a sectional view of another aspect of a semiconductor device including a complex dielectric layer according to some embodiments of the inventive concept.

FIG. 3 is a sectional view of another aspect of a semiconductor device 3 including a complex dielectric layer 500 according to some embodiments of the inventive concept.

Referring to FIG. 3, a lower electrode layer 400 may have a pillar-shape. In order to form the pillar-shaped lower electrode layer 400, for example, a mold layer (not shown) may be formed on an interlayer insulating layer 200 having a contact plug 300. Then, an opening (not shown) exposing the contact plug 300 is formed in the mold layer, and a lower electrode material layer (not shown) may be formed on the mold layer in such a way that the opening is completely filled. Then, the lower electrode material layer formed on a surface of the mold layer is removed while a portion of the lower electrode material layer in the opening remains, and the mold layer is removed.

In this regard, to prevent the interlayer insulating layer 200 from being removed when the mold layer is removed, an etch stopping pattern 310 exposing the contact plug 300 may be formed on the interlayer insulating layer 200.

The complex dielectric layer 500 and an upper electrode layer 600 may be sequentially formed on the pillar-shaped lower electrode layer 400. Thus, the semiconductor device 3 including a capacitor is formed.

Figure 4:
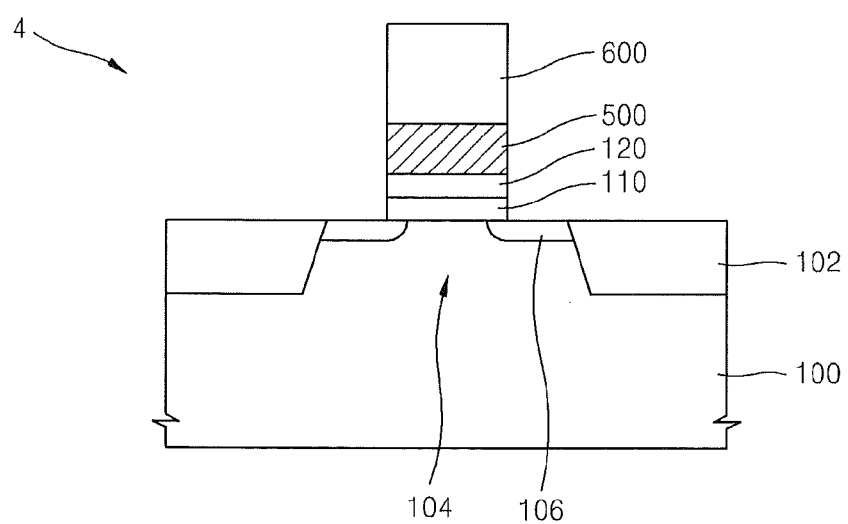
FIG. 4 is a sectional view of another aspect of a semiconductor device including a complex dielectric layer according to some embodiments of the inventive concept.

FIG. 4 is a sectional view of another aspect of a semiconductor device 4 including a complex dielectric layer 500 according to some embodiments of the inventive concept.

Referring to FIG. 4, the semiconductor device 4 may include the complex dielectric layer 500 as a blocking insulating layer. A tunneling oxidation layer 110 may be formed on a semiconductor substrate 100. The semiconductor substrate 100 may be formed of, for example, a semiconductor material, such as silicon. For example, an impurity implantation region (not shown) such as a well that is used to fabricate a semiconductor device such as a transistor, a device isolation layer 102 for separating individual semiconductor devices from each other, and source and drain regions 106 may be formed in the semiconductor substrate 100.

The tunneling insulation layer 110 may be formed such that the tunneling insulation layer 110 enables a tunneling operation, and may have a thickness of 30 to 800 Å. The tunneling insulation layer 110 may include a silicon oxidation layer ($SiO_2$) or may include an insulating layer with a high dielectric constant, such as an oxidation layer of hafnium or zirconium. However, the tunneling insulation layer 110 is not limited thereto.

A charge storage layer 120 may be formed on the tunneling insulation layer 110. The charge storage layer 120 may have a thickness of 20 to 200 Å, and may be formed of a conductive material or an insulating material. When the charge storage layer 120 is formed of a conductive material, the charge storage layer 120 may function as a floating gate. In this case, the charge storage layer 120 may be a conductive material including an un-doped polysilicon, an n-type or p-type impurity-doped polysilicon, or metal.

When the charge storage layer 120 is formed of an insulating material, the charge storage layer 120 may function as a trap layer. The charge storage layer 120 functioning as a trap layer may be formed of a material with a dielectric constant that is higher than that of a silicon oxidation layer and lower than that of a blocking insulating layer, which will be described later. For example, if the dielectric constant of the silicon oxidation layer is 3.9, the charge storage layer 120 may include a silicon nitride layer that has a dielectric constant of about 6, which is higher than 3.9. Accordingly, the blocking insulating layer may be formed such that the dielectric constant thereof is higher than 6. In this case, the charge storage layer 120 may include a nitride layer such as a silicon nitride layer, an aluminum nitride layer, or a silicon oxynitride layer.

The complex dielectric layer 500 may be formed as the blocking insulating layer on the charge storage layer 120, and an electrode layer 600 is formed on the complex dielectric layer 500. The complex dielectric layer 500 may include an amorphous metallic silicate layer and a crystalline metal-based insulating layer and will be described in detail later. The crystalline metal-based insulating layer may include a crystalline metallic oxide or a crystalline metallic silicate. The electrode layer 600 may include at least one conductive material selected from the group consisting of, for example, doped polysilicon, metal (Al, W, Cu, Ti, Ir, Ru, Pt, etc.), metallic silicide, metallic nitride, and conductive metallic oxide ($RuO_2$, $IrO_2$, $SrRuO_3$, etc.).

When the crystalline metal-based insulating layer is used as the blocking insulating layer, the crystalline metal-based insulating layer may not have a perfectly homogenous crystal structure. Accordingly, the blocking insulating layer including the crystalline metal-based insulating layer may have a grain boundary. Accordingly, when the blocking insulating layer including the crystalline metal-based insulating layer is formed on the charge storage layer 120 that is formed of a conductive material, the blocking insulating layer may be slightly affected by a crystal structure of the charge storage layer 120. Accordingly, it may appear that a grain boundary of the charge storage layer 120 is connected to a grain boundary of the blocking insulating layer.

Likewise, when the electrode layer 600 is formed on the blocking insulating layer including the crystalline metal-based insulating layer, the upper electrode layer 600 may be slightly affected by a crystal structure of the blocking insulating layer. Accordingly, it may appear that the grain boundary of the blocking insulating layer is connected to a grain boundary of the upper electrode layer 600.

Since the connected grain boundary may function as a passage for a leakage current, formation of the connected grain boundary may lead to a high leakage current. However, if the complex dielectric layer 500 including the crystalline metal-based insulating layer and the amorphous metallic silicate layer is used as the blocking insulating layer, the formation of the connected grain boundary or the passage for the leakage current may be blocked by using the amorphous metallic silicate layer.

As described above, when the charge storage layer 120 is formed of a conductive material, a typical flash memory that is a floating gate-type non-volatile memory device may be formed. On the other hand, when the charge storage layer 120 is formed of an insulating material, a charge trap-type flash memory that is a floating trap-type non-volatile memory device may be formed.

FIGS. 5 through 11 are sectional views of aspects of a complex dielectric layer according to some embodiments of the inventive concept. The aspects of the complex dielectric layer described in connection with FIGS. 5 to 11 all may be selectively applied to the aspects of a semiconductor device including a complex dielectric layer according to some embodiments of the inventive concept described in connection with FIGS. 1 to 4.

Figure 5:
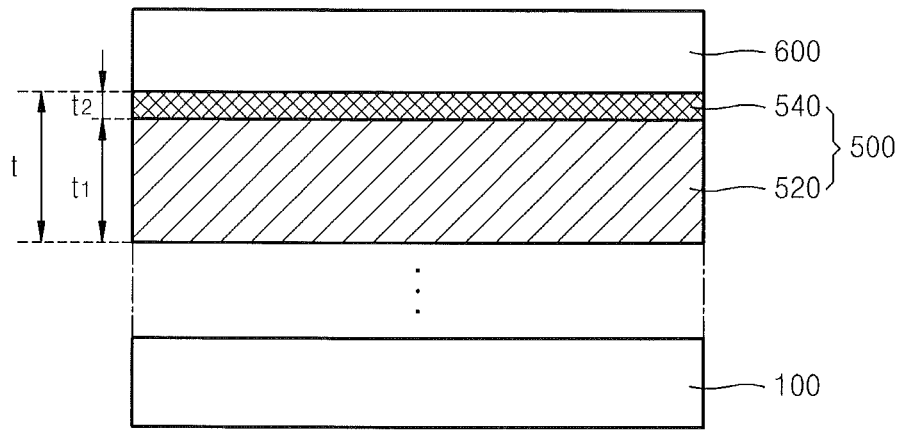
FIG. 5 is a sectional view of an aspect of a complex dielectric layer according to some embodiments of the inventive concept.

FIG. 5 is a sectional view of an aspect of a complex dielectric layer 500 according to some embodiments of the inventive concept.

Referring to FIG. 5, the complex dielectric layer 500 may include a crystalline metal-based insulating layer 520 and an amorphous metallic silicate layer 540. The complex dielectric layer 500 may be formed by forming the crystalline metal-based insulating layer 520 on a semiconductor substrate 100 and then forming the amorphous metallic silicate layer 540 on the crystalline metal-based insulating layer 520.

The crystalline metal-based insulating layer 520 may be formed of crystalline metallic oxide or crystalline metallic silicate. That is, the crystalline metal-based insulating layer 520 may be a crystalline metallic oxide layer formed of the same material or a crystalline metallic silicate layer formed of the same material. In this regard, the crystalline metal-based insulating layer 520 may be a multi-layered crystalline metallic oxide layer formed of the same material or a multi-layered crystalline metallic silicate layer formed of the same material. Alternatively, the crystalline metal-based insulating layer 520 may be a multi-layered crystalline metallic oxide layer including at least two different material layers or a multi-layered crystalline metallic silicate layer including at least two different material layers. Alternatively, the crystalline metal-based insulating layer 520 may be a multilayer including the crystalline metallic oxide and the crystalline metallic silicate.

A crystalline metallic oxide that constitutes the crystalline metal-based insulating layer 520 may be, for example, titanium oxide ($TiO_2$), hafnium oxide ($HfO_2$), zirconium oxide ($ZrO_2$), hafnium-zirconium oxide (($Hf,Zr)O_2$), or aluminum oxide ($Al_2O_3$) or a metallic oxide including titanium (Ti), hafnium (Hf), zirconium (Zr), or aluminum (Al).

A crystalline metallic silicate that constitutes the crystalline metal-based insulating layer 520 may be, for example, hafnium silicate ($Hf_{x1}Si_{y1}O_{z1}$), zirconium silicate ($Zr_{x2}Si_{y2}O_{z2}$), hafnium-zirconium silicate (($Hf,Zr)_{x3}Si_{y3}O_{z3}$), or aluminum silicate ($Al_{x4}Si_{y4}O_{z4}$) or a metallic oxide including titanium (Ti), hafnium (Hf), zirconium (Zr), or aluminum (Al).

The crystalline metallic silicate that constitutes the crystalline metal-based insulating layer 520 may include metal atoms and silicon atoms, and a ratio of the silicon atoms with respect to sums of the metal atoms and the silicon atoms will be referred to as a silicon concentration. Since as silicon concentration is higher, a formed thin layer may have a higher density due to a compression stress caused by the silicon atoms, insulating characteristics may be further enhanced. However, the higher silicon concentration may lead to a smaller dielectric constant of the thin layer. Accordingly, the silicon concentration may be in the range of 1% to 10%. For example, in order to obtain stable crystallinity and a high dielectric constant, the silicon concentration may be in the range of 3% to 8%.

The crystalline metallic silicate that constitutes the crystalline metal-based insulating layer 520 may be formed by forming a multilayer in which a metallic oxide layer including metal atoms and a silicon oxidation layer are alternately deposited and heat treating the multilayer. In regard to each of the metallic oxide layer and the silicon oxidation layer, a thickness and the number of layers may be determined in consideration of the silicon concentration of the crystalline metallic silicate.

Titanium oxide ($TiO_2$), which is able to be used to form the crystalline metal-based insulating layer 520, may have a rutile structure in a tetragonal system. In addition, hafnium oxide ($HfO_2$), zirconium oxide ($ZrO_2$), hafnium-zirconium oxide (($Hf,Zr)O_2$), hafnium silicate ($Hf_{x1}Si_{y1}O_{z1}$), zirconium silicate ($Zr_{x2}Si_{y2}O_{z2}$), and hafnium-zirconium silicate (($Hf,Zr)_{x3}Si_{y3}O_{z3}$)), which may be used to form the crystalline metal-based insulating layer 520, may have a crystal structure of a cubic system, a tetragonal system, or an orthorhombic system.

In cubic system, tetragonal system, and orthorhombic system, there are three crystal axes perpendicular one another ($\theta_1=\theta_2=\theta_3=90°$. All of three lattice constants are identical ($a_1=a_2=a_3$) in the cubic system. The cubic system may also be referred to as an isometric system. Two of three lattice constants are identical to each other and the one of the lattice constants is different from the two ($a_4=a_5 \neq a_6$) in the tetragonal system. All of lattice constants are different one another ($a_7 \neq a_8$, $a_8 \neq a_9$, $a_7 \neq a_9$) in the orthorhombic system.

When an oxide or silicate including hafnium or zirconium, which may be used to form the crystalline metal-based insulating layer 520 according to some embodiments of the inventive concept, that is, hafnium oxide ($HfO_2$), zirconium oxide ($ZrO_2$), hafnium-zirconium oxide (($Hf,Zr)O_2$), hafnium silicate ($Hf_{x1}Si_{y1}O_{z1}$), zirconium silicate ($Zr_{x2}Si_{y2}O_{z2}$), or hafnium-zirconium silicate (($Hf,Zr)_{x3}Si_{y3}O_{z3}$), is used to form a very thin layer for use in a highly integrated semiconductor device, it may be difficult to distinguish the values of lattice constants. Accordingly, in this case, the crystal system will be described as "a cubic system", a "tetragonal system", or "an orthorhombic system."

The crystalline metal-based insulating layer 520 may be formed by depositing an amorphous material and subsequently heat treating the amorphous material to obtain crystallinity. Alternatively, the crystallinity of the crystalline metal-based insulating layer 520 may be obtained in-situ. Alternatively, when the crystalline metal-based insulating layer 520 is a multilayer, a lower layer that may be crystallized by heat treatment at relatively low temperature is formed, and then an upper layer may be formed on the crystalline lower layer. In this case, a heat treatment for crystallizing the upper layer may not be performed. Alternatively, the upper layer may be crystallized by heat treating at a temperature that is lower than a temperature at which the upper layer has crystallinity by heat treating when only the upper layer is formed and the lower layer is not formed.

Alternatively, in order to form the crystalline metal-based insulating layer 520, a first layer that may be crystallized by heat treatment at a first temperature that is a relatively low temperature, and a second layer that may be crystallized by heat treatment at a second temperature that is relatively a high temperature are alternately disposed, and then the first and second layers are heat treated at a third temperature between the first temperature and the second temperature, so that the first layer and the second layer all have crystallinity. In this case, through the teat treatment at the third temperature that is higher than the first temperature, the first layer is first crystallized before the second layer and functions as a seed with respect to the second layer so that the second layer may have crystallinity at the second temperature lower than the third temperature.

Generally, metal silicate may be crystallized at a relatively lower temperature than metallic oxide. In addition, metallic oxide or metal silicate including zirconium may be crystallized at a relatively lower temperature than metallic oxide or metal silicate including hafnium. For example, hafnium silicate may be crystallized at a relatively lower temperature than hafnium oxide, and zirconium silicate may be crystallized at a relatively lower temperature than hafnium silicate. As another example, hafnium-zirconium silicate in which a percentage of zirconium is relatively high may be crystallized at a relatively lower temperature than hafnium-zirconium silicate in which a percentage of zirconium is relatively low.

As described above, the crystalline metal-based insulating layer 520 may have various structures. However, the following description will be presented by way of example with reference to embodiments where the crystalline metal-based insulating layer 520 is a single layer. Other example cases, that is, when the crystalline metal-based insulating layer 520 is a multilayer, will be described later.

Referring to FIG. 5, the crystalline metal-based insulating layer 520 may be disposed closer to the semiconductor substrate 100 than the amorphous metallic silicate layer 540, and the amorphous metallic silicate layer 540 may be disposed between the crystalline metal-based insulating layer 520 and the an electrode layer 600. Accordingly, the amorphous metallic silicate layer 540 may reduce and/or prevent formation of a connected grain boundary between the electrode layer 600 and the crystalline metal-based insulating layer 520.

In this case, the amorphous metallic silicate layer 540 and the crystalline metal-based insulating layer 520 may have at least one common metal atom. For example, if the crystalline metal-based insulating layer 520 includes a crystalline metallic oxide or crystalline metallic silicate including a hafnium atom, the amorphous metallic silicate layer 540 may also include an amorphous metallic silicate including a hafnium atom.

If the crystalline metal-based insulating layer 520 includes a crystalline metallic oxide or crystalline metallic silicate including a plurality of metal atoms, the amorphous metallic silicate layer 540 may include an amorphous metallic silicate including at least one metal atom selected from the metal atoms. Alternatively, if the crystalline metal-based insulating layer 520 includes a crystalline metallic oxide or crystalline metallic silicate including a plurality of metal atoms, the amorphous metallic silicate layer 540 may include an amorphous metallic silicate including at least a metal atom that has a high percentage point among the metal atoms. By doing so, a boundary characteristic between the crystalline metal-based insulating layer 520 and the amorphous metallic silicate layer 540 may be improved.

Since a dielectric constant of the amorphous metallic silicate layer 540 may be lower than a dielectric constant of the crystalline metal-based insulating layer 520, a thickness $t_2$ of the amorphous metallic silicate layer 540 of the complex dielectric layer 500 may be set to be lower than a thickness $t_1$ of the crystalline metal-based insulating layer 520, so that the complex dielectric layer 500 may have a sufficient dielectric constant. For example, the thickness $t_2$ of the amorphous metallic silicate layer 540 is set to be a third or lower of the thickness $t_1$ of the crystalline metal-based insulating layer 520, so that the thickness $t_2$ of the amorphous metallic silicate layer 540 is a fourth or lower of the total thickness of the complex dielectric layer 500.

Even when the crystalline metal-based insulating layer 520 is a multilayer or include a plurality of separated layers, which will be described later, a thickness ratio of the crystalline metal-based insulating layer 520 to the amorphous metallic silicate layer 540, that is, a ratio of the thickness $t_2$ of the amorphous metallic silicate layer 540 to the total thickness of the complex dielectric layer 500 may be the same as described above.

Each of the crystalline metal-based insulating layer 520 and the amorphous metallic silicate layer 540 may be formed by atomic layer deposition (ALD). Accordingly, in order to reduce and/or minimize a decrease in the dielectric constant of the complex dielectric layer 500 substantially and to block a leakage current of the complex dielectric layer 500, the amorphous metallic silicate layer 540 may have a thickness of about 10 Angstroms (Å) or less.

Figure 6:
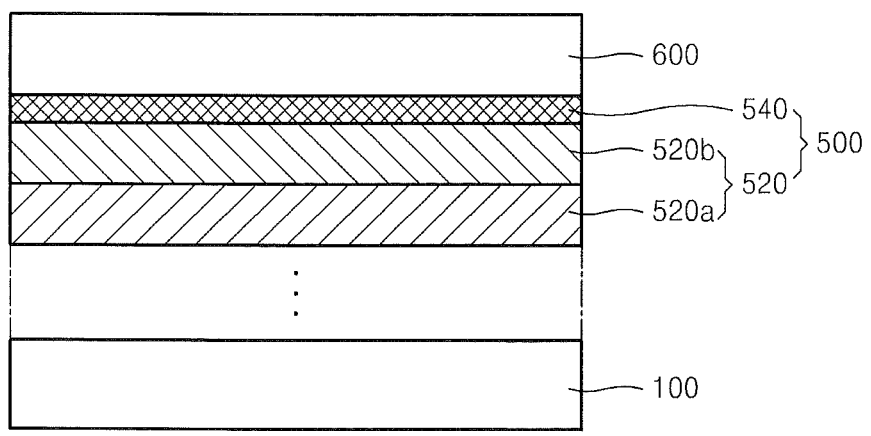
FIG. 6 is a sectional view of another aspect of a complex dielectric layer according to some embodiments of the inventive concept.

FIG. 6 is a sectional view of an aspect of a complex dielectric layer 500 according to some embodiments of the inventive concept.

Referring to FIG. 6, the complex dielectric layer 500 may include a first crystalline metal-based insulating layer 520a, a second crystalline metal-based insulating layer 520b, and an amorphous metallic silicate layer 540 which are sequentially deposited in the stated order between the semiconductor substrate 100 and the electrode layer 600. That is, the crystalline metal-based insulating layer 520 may include a multilayer.

In this regard, the amorphous metallic silicate layer 540 and the second crystalline metal-based insulating layer 520b contacting the amorphous metallic silicate layer 540 may have at least one common metal atom. For example, if the second crystalline metal-based insulating layer 520b includes a crystalline metallic oxide or crystalline metallic silicate including a hafnium atom, the amorphous metallic silicate layer 540 may also include an amorphous metallic silicate including a hafnium atom. In particular, when the second crystalline metal-based insulating layer 520b directly contacts the amorphous metallic silicate layer 540, a boundary characteristic may be improved.

Figure 7:
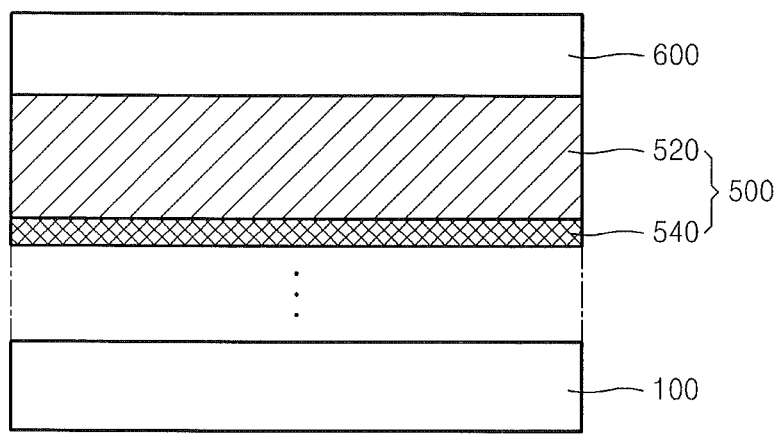
FIG. 7 is a sectional view of another aspect of a complex dielectric layer according to some embodiments of the inventive concept.

FIG. 7 is a sectional view of another aspect of a complex dielectric layer 500 according to some embodiments of the inventive concept.

Referring to FIG. 7, the complex dielectric layer 500 is formed by forming an amorphous metallic silicate layer 540 on a semiconductor substrate 100 and then forming a crystalline metal-based insulating layer 520 on the amorphous metallic silicate layer 540.

By doing so, the amorphous metallic silicate layer 540 may block a leakage current flowing toward the semiconductor substrate 100. In particular, when the lower electrode layer 400 illustrated in FIGS. 1 through 3 is formed between the amorphous metallic silicate layer 540 and the semiconductor substrate 100, or when the charge storage layer 120 illustrated in FIG. 4 is formed between the amorphous metallic silicate layer 540 and the semiconductor substrate 100 and is formed of a conductive material, formation of a connected grain boundary between the crystalline metal-based insulating layer 520 and the lower electrode layer 400 or the charge storage layer 120 which is conductive may be reduced and/or prevented.

Figure 8:
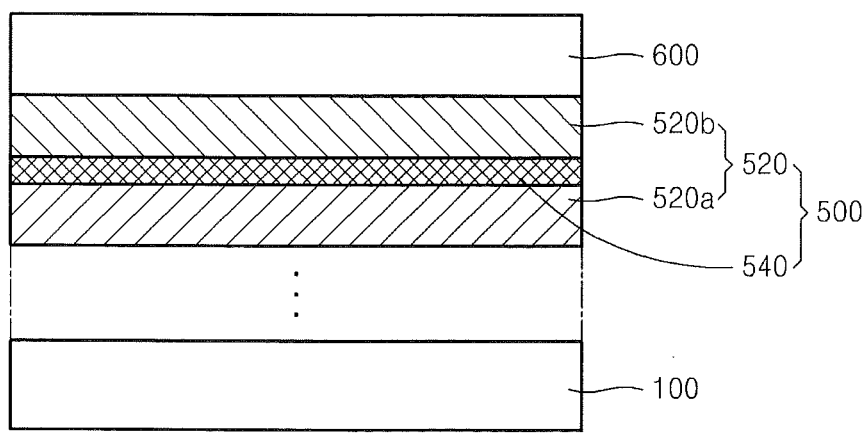
FIG. 8 is a sectional view of another aspect of a complex dielectric layer according to some embodiments of the inventive concept.

FIG. 8 is a sectional view of another aspect of a complex dielectric layer 500 according to some embodiments of the inventive concept.

Referring to FIG. 8, the complex dielectric layer 500 includes a first crystalline metal-based insulating layer 520a, an amorphous metallic silicate layer 540, and a second crystalline metal-based insulating layer 520b which are sequentially deposited in the stated order between the semiconductor substrate 100 and the electrode layer 600. That is, the amorphous metallic silicate layer 540 is interposed between the first crystalline metal-based insulating layer 520a and the second crystalline metal-based insulating layer 520b which form the crystalline metal-based insulating layer 520.

Accordingly, the amorphous metallic silicate layer 540 may reduce and/or prevent formation of a connected grain boundary between the first crystalline metal-based insulating layer 520a and the second crystalline metal-based insulating layer 520b and thus, a leakage current may be reduced and/or may not occur.

In this regard, the amorphous metallic silicate layer 540 and the first crystalline, metal-based insulating layer 520a contacting the amorphous metallic silicate layer 540 may have at least one common metal atom and the amorphous metallic silicate layer 540 and the second crystalline metal-based insulating layer 520b contacting the amorphous metallic silicate layer 540 may have at least one common metal atom. For example, if each of the first and second crystalline metal-based insulating layers 520a and 520b includes a crystalline metallic oxide or crystalline metallic silicate including a hafnium atom, the amorphous metallic silicate layer 540 may also include an amorphous metallic silicate including a hafnium atom.

For example, when the first crystalline metal-based insulating layer 520a includes a crystalline metallic oxide or crystalline metallic silicate including a hafnium atom and the second crystalline metal-based insulating layer 520b includes a crystalline metallic oxide or crystalline metallic silicate including a hafnium atom, the amorphous metallic silicate layer 540 may include an amorphous metallic silicate including a hafnium atom and a zirconium atom. In particular, when the amorphous metallic silicate layer 540 directly contacts each of the first and second crystalline metal-based insulating layers 520a and 520b, a boundary characteristic may be improved.

Figure 9:
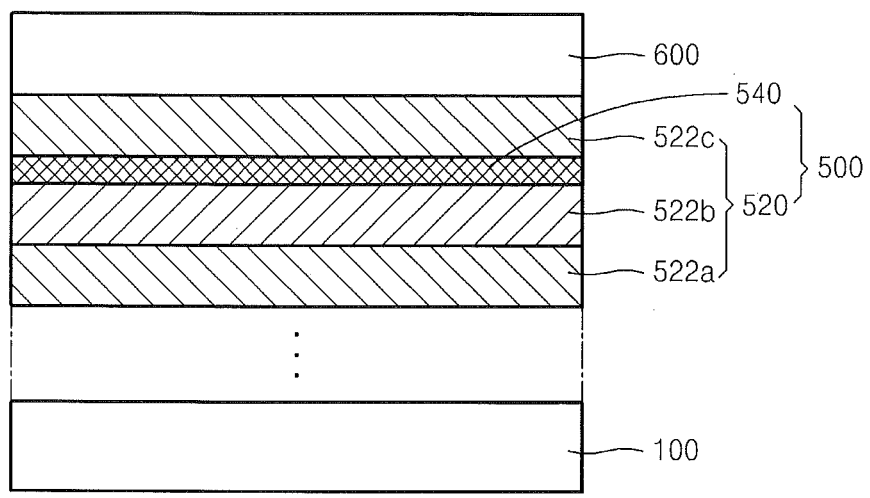
FIG. 9 is a sectional view of another aspect of a complex dielectric layer according to some embodiments of the inventive concept.

FIG. 9 is a sectional view of another aspect of a complex dielectric layer 500 according to some embodiments of the inventive concept.

Referring to FIG. 9, the complex dielectric layer 500 includes a first crystalline metal-based insulating layer 522a, a second crystalline metal-based insulating layer 522b, an amorphous metallic silicate layer 540, and a third crystalline metal-based insulating layer 522c which are sequentially deposited in the stated order between the semiconductor substrate 100 and the electrode layer 600. That is, the amorphous metallic silicate layer 540 is disposed between the second crystalline metal-based insulating layer 522b and the third crystalline metal-based insulating layer 522c among the first crystalline metal-based insulating layer 522a, the second crystalline metal-based insulating layer 522b, and the third crystalline metal-based insulating layer 522c which constitutes the crystalline metal-based insulating layer 520.

Accordingly, the amorphous metallic silicate layer 540 may reduce and/or prevent formation of a connected grain boundary between the second crystalline metal-based insulating layer 522b and the third crystalline metal-based insulating layer 522c and thus, a leakage current may be reduced and/or may not occur.

In this regard, the amorphous metallic silicate layer 540 and the second crystalline metal-based insulating layer 522b contacting the amorphous metallic silicate layer 540 may have at least one common metal atom and the amorphous metallic silicate layer 540 and the third crystalline metal-based insulating layer 522c contacting the amorphous metallic silicate layer 540 may have at least one common metal atom. However, it is not necessary that the amorphous metallic silicate layer 540 and the first crystalline metal-based insulating layer 522a, which does not contact the amorphous metallic silicate layer 540, have at least one common metal atom.

Figure 10:
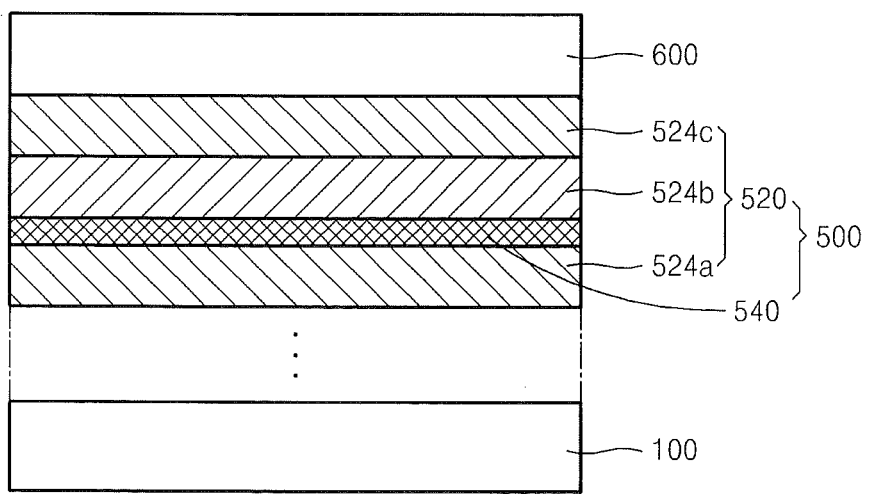
FIG. 10 is a sectional view of another aspect of a complex dielectric layer according to some embodiments of the inventive concept.

FIG. 10 is a sectional view of another aspect of a complex dielectric layer 500 according to some embodiments of the inventive concept.

Referring to FIG. 10, the complex dielectric layer 500 includes a first crystalline metal-based insulating layer 524a, an amorphous metallic silicate layer 540, a second crystalline metal-based insulating layer 524b, and a third crystalline metal-based insulating layer 524c which are sequentially deposited in the stated order between the semiconductor substrate 100 and the electrode layer 600. Unlike the complex dielectric layer 500 illustrated in FIG. 9, the amorphous metallic silicate layer 540 is disposed between the first crystalline metal-based insulating layer 524a and the second crystalline metal-based insulating layer 524b among the first crystalline metal-based insulating layer 524a, the second crystalline metal-based insulating layer 524b, and the third crystalline metal-based insulating layer 524c which constitute the crystalline metal-based insulating layer 520.

Figure 11:
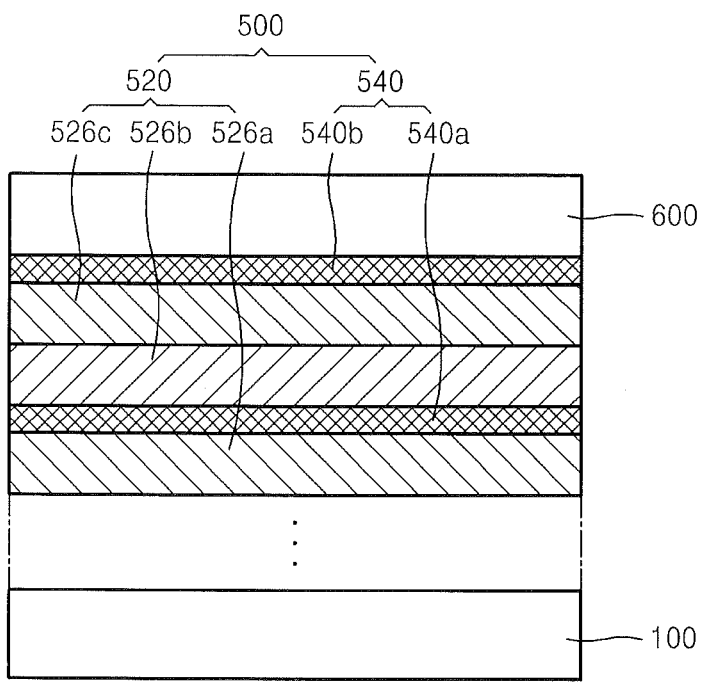
FIG. 11 is a sectional view of another aspect of a complex dielectric layer according to some embodiments of the inventive concept.

FIG. 11 is a sectional view of another aspect of a complex dielectric layer 500 according to some embodiments of the inventive concept.

Referring to FIG. 11, the complex dielectric layer 500 includes a first crystalline metal-based insulating layer 526a, a first amorphous metallic silicate layer 540a, a second crystalline metal-based insulating layer 526b, a third crystalline metal-based insulating layer 526c, and a second amorphous metallic silicate layer 540b which are sequentially deposited in the stated order between the semiconductor substrate 100 and the electrode layer 600.

That is, the first amorphous metallic silicate layer 540a and the second amorphous metallic silicate layer 540b of the amorphous metallic silicate layer 540 may directly contact each other or may be separated from each other.

In this case, the first amorphous metallic silicate layer 540a may reduce and/or prevent formation of a connected grain boundary between the first crystalline metal-based insulating layer 526a and the second crystalline metal-based insulating layer 526b, and the second amorphous metallic silicate layer 540b may reduce and/or prevent formation of a connected grain boundary between the third crystalline metal-based insulating layer 526c and the electrode layer 600. An amorphous metallic silicate layer 540 may include the first amorphous metallic silicate layer 540a which reduces/prevents formation of a grain boundary in a crystalline metal-based insulating layer 520 and the second amorphous metallic silicate layer 540b which reduces/prevents formation of a grain boundary between the crystalline metal-based insulating layer 520 and the electrode layer 600.

In order for the complex dielectric layer 500 to have a sufficiently high dielectric constant, the thickness of the amorphous metallic silicate layer 540 may be reduced and/or minimized in comparison with the thickness of the crystalline metal-based insulating layer 520 as long as the amorphous metallic silicate layer 540 retains its insulating characteristics. Accordingly, the amorphous metallic silicate layer 540 may be formed to have a multi-layer structure or a layer including include a plurality of separated layers.

Figure 12:
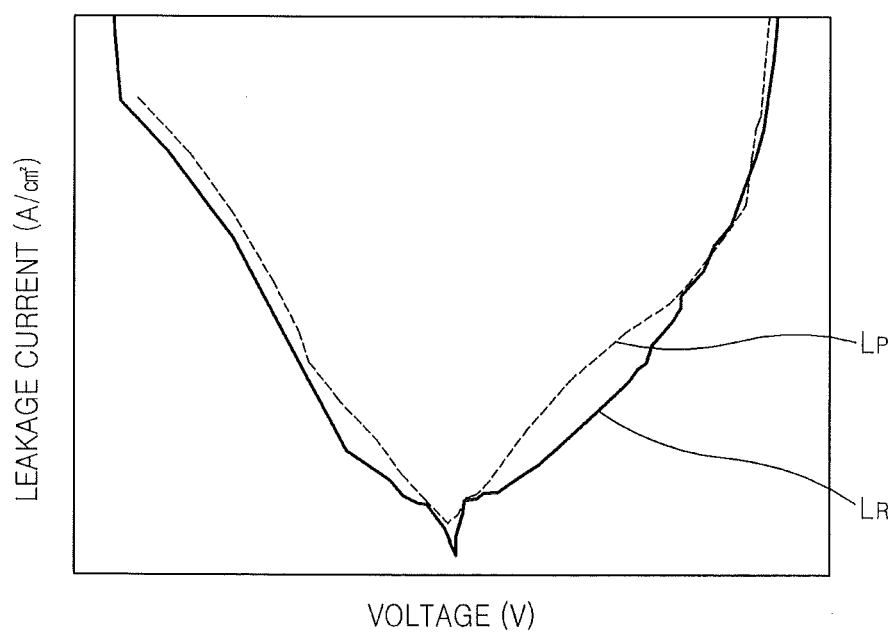
FIG. 12 is a graph to compare a leakage current of a complex dielectric layer according to some embodiments of the inventive concept with a leakage current of a crystalline metal-based insulating layer.

FIG. 12 is a graph to compare a leakage current of a complex dielectric layer according to some embodiments of the inventive concept with a leakage current of a crystalline metal-based insulating layer.

Referring to FIG. 12, a leakage current $L_P$ characteristic of the complex dielectric layer 500 according to some embodiments of the inventive concept is improved and/or better than a leakage current $L_R$ characteristic of a dielectric layer including only a crystalline metal-based insulating layer, that is, when the amorphous metallic silicate layer 540 illustrated in FIGS. 5 through 11 is not formed. That is, at the same voltage V, a leakage current $L_P$ characteristic of the complex dielectric layer 500 according to some embodiments of the inventive concept is smaller than a leakage current $L_R$ characteristic of the dielectric layer including only a crystalline metal-based insulating layer.

Accordingly, it can be seen that when the complex dielectric layer 500 according to some embodiments of the inventive concept illustrated in FIGS. 5 through 11 is used as a capacitor dielectric layer or a blocking insulating layer, improved insulating characteristics may be obtained.

Figure 13:
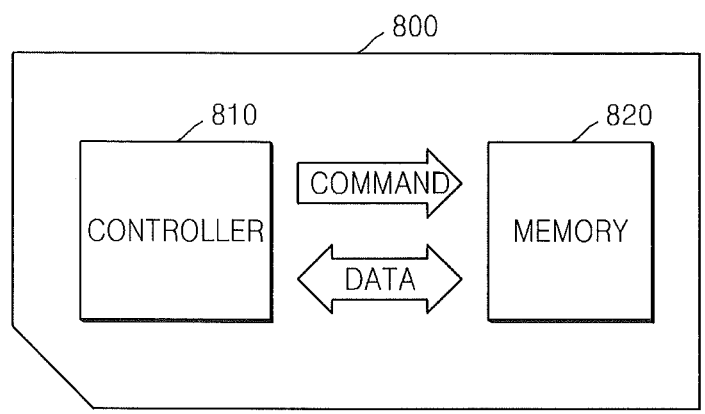
FIG. 13 is a schematic diagram of a card according to some embodiments of the inventive concept.

FIG. 13 is a schematic diagram of a card 800 according to some embodiments of the inventive concept.

Referring to FIG. 13, a controller 810 and a memory 820 are disposed such that the controller 810 and the memory 820 exchange an electrical signal. For example, in correspondence to a command of the controller 810, the memory 820 and the controller 810 may exchange data. By doing so, the card 800 inputs data in the memory 820 or outputs data stored in the memory 820 to outside.

The memory 820 may include a memory device such as the semiconductor devices illustrated in FIGS. 1 through 4. The memory device used herein may not be limited and may be, for example, a DRAM, a SRAM, a flash memory, or a phase change RAM (PRAM), but is not limited to these devices.

The card 800 may be used in various portable electronic devices, such as a multi media card (MMC) or a secure digital card (SD card).

Figure 14:
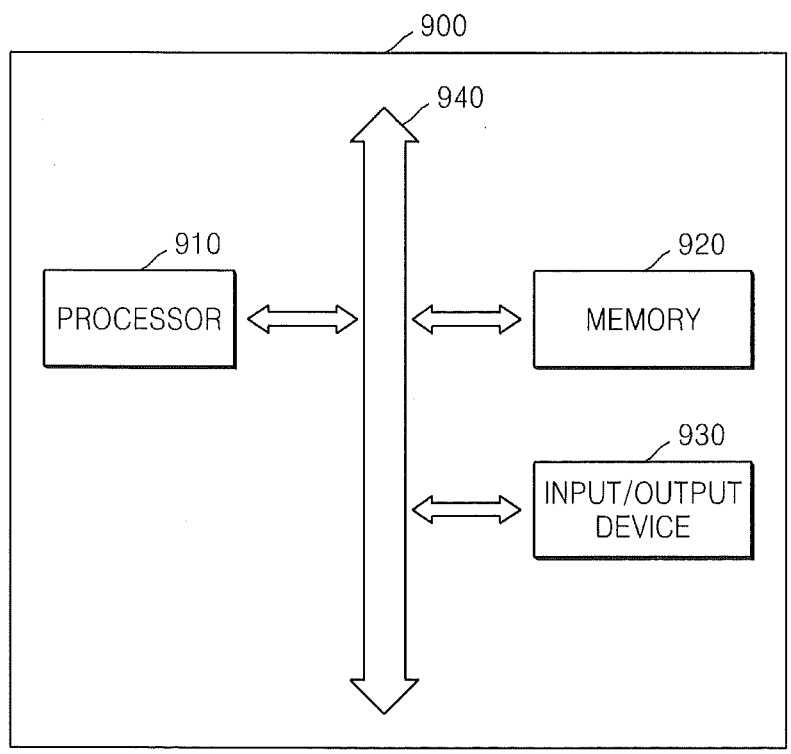
FIG. 14 is a block diagram of a system according to some embodiments of the inventive concept.

FIG. 14 is a block diagram of a system 900 according to some embodiments of the inventive concept.

Referring to FIG. 14, a processor 910, an input/output device 930, and a memory 920 may data-communicate with each other via a bus 940. The processor 910 executes programs and controls the system 900. The input/output device 930 may be used to input or output data of the system 900. The system 900 may be connected to an external device, for example, a personal computer or a network through the input/output device 930, and may data-communicate with the external device.

The memory 920 may store a code and data for driving the processor 910. The memory 920 may include a memory device such as the semiconductor devices illustrated in FIGS. 1 through 4. The memory device used herein may be, for example, a DRAM, a SRAM, a flash memory, or a phase change RAM (PRAM), but is not limited to these devices.

For example, the system 900 may be used in various portable electronic devices including a mobile phone, an MP3 player, a navigation device, a solid state disk (SSD), and household appliances.

While the inventive concept has been particularly shown and described with reference to exemplary embodiments thereof, it will be understood that various changes in form and details may be made therein without departing from the spirit and scope of the following claims.

What is claimed is:

1. An electronic device, comprising:
a lower layer;
a complex dielectric layer on the lower layer, the complex dielectric layer comprising an amorphous metal silicate layer and a crystalline metal-based insulating layer thereon; and
an upper layer on the complex dielectric layer,
wherein the amorphous metal silicate layer prevents connection of respective grain boundaries between the crystalline metal-based insulating layer and a conductive layer or between sublayers of the crystalline metal-based insulating layer.

2. The device of claim 1, wherein the amorphous metal silicate layer and the crystalline metal-based insulating layer are in direct contact and comprise an identical metal.

3. The device of claim 2, wherein the metal comprises a higher percentage of the crystalline metal-based insulating layer than at least one other metal included therein.

4. The device of claim 3, wherein the metal comprises hafnium andor zirconium.

5. The device of claim 3, wherein the lower layer comprises:
a substrate comprising an active region including at least one transistor.

6. The device of claim 5, wherein the upper layer comprises an upper electrode layer directly on the complex dielectric layer, and further comprising:

a lower electrode layer or a charge storage layer directly on the complex dielectric layer between the complex dielectric layer and the substrate.

7. The device of claim 6, wherein the crystalline metal-based insulating layer comprises a crystalline metallic oxide andor a crystalline metallic silicate.

8. The device of claim 7, wherein the crystalline metal-based insulating layer comprises a multilayer comprising at least two layers selected from the group consisting of a crystalline titanium-based insulating layer, a crystalline hafnium-based insulating layer, a crystalline zirconium-based insulating layer, and a crystalline hafnium-zirconium -based insulating layer.

9. The device of claim 8, wherein the amorphous metal silicate layer is disposed in the multilayer between the at least two layers.

10. The device of claim 9, wherein the amorphous metal silicate layer and the at least two layers of the multilayer that are in direct contact with the amorphous metal silicate layer comprise at least one common metal atom.

11. The device of claim 1, wherein a thickness of the amorphous metal silicate layer is less than that of the crystalline metal-based insulating layer.

12. The device of claim 11, wherein the thickness of the amorphous metal silicate layer is a fourth or less than a total thickness of the complex dielectric layer.

13. The device of claim 11, wherein a thickness of the amorphous metal silicate layer is equal to or less than about 10 Angstroms (Å).

14. The device of claim 1, wherein the amorphous metal silicate layer comprises hafnium and/or zirconium.

15. The device of claim 1, wherein the amorphous metal silicate layer comprises at least two layers, and wherein the crystalline metal-based insulating layer is between the at least two layers.

16. The device of claim 1, wherein the amorphous metal silicate layer is disposed between the crystalline metal-based insulating layer and the lower layer.

17. The device of claim 1, wherein the amorphous metal silicate layer is disposed between the crystalline metal-based insulating layer and the upper layer.

18. An integrated circuit device, comprising:
a substrate comprising an active region including at least one transistor;
an interlayer insulating layer including a contact plug extending therethrough that is electrically connected to the transistor;
a lower electrode layer on the interlayer insulating layer and electrically connected to the contact plug;
a capacitor dielectric layer on the lower electrode layer; and
an upper electrode layer on the capacitor dielectric layer,
wherein the capacitor dielectric layer is a complex dielectric layer comprising an amorphous metallic silicate layer and a crystalline metal-based insulating layer,
wherein the amorphous metallic silicate layer prevents connection of respective grain boundaries between the crystalline metal-based insulating layer and a conductive layer or between sublayers of the crystalline metal-based insulating layer.

19. An integrated circuit device, comprising:
a substrate comprising an active region therein;
a tunneling insulation layer and a charge storage layer sequentially stacked on the active region;
a blocking insulating layer on the charge storage layer; and
an electrode layer on the blocking insulating layer, wherein the blocking insulating layer is a complex dielectric layer comprising an amorphous metallic silicate layer and a crystalline metal-based insulating layer, wherein the amorphous metallic silicate layer prevents connection of respective grain boundaries between the crystalline metal-based insulating layer and a conductive layer or between sublayers of the crystalline metal-based insulating layer.

20. The device of claim 19, wherein the amorphous metallic silicate layer has a lower dielectric constant than the crystalline metal-based insulating layer, and wherein the charge storage layer has a lower dielectric constant than the amorphous metallic silicate layer.

* * * * *